United States Patent [19]

Hammond et al.

[11] Patent Number: 5,038,808
[45] Date of Patent: Aug. 13, 1991

[54] HIGH FREQUENCY ULTRASONIC SYSTEM

[75] Inventors: Peter Hammond, Rochester; Kevin S. Schumacher, North Caldwell, both of N.Y.

[73] Assignee: S&K Products International, Inc., Chestnut Ridge, N.Y.

[21] Appl. No.: 493,808

[22] Filed: Mar. 15, 1990

[51] Int. Cl.$^5$ .............................................. B08B 3/12
[52] U.S. Cl. ..................................... 134/184; 134/1; 134/902
[58] Field of Search ................... 134/902, 1, 184, 185, 134/186, 194

[56] References Cited

U.S. PATENT DOCUMENTS

| | | | |
|---|---|---|---|
| 3,001,769 | 9/1961 | Plassmeyer | 134/1 X |
| 3,240,963 | 3/1966 | Sasaki | 134/1 X |
| 3,573,983 | 4/1971 | Antonevich | 134/1 |
| 3,893,869 | 7/1975 | Mayer et al. | 134/184 X |
| 4,118,649 | 10/1978 | Schwartzman et al. | 310/337 |
| 4,326,553 | 4/1982 | Hall | 134/1 X |
| 4,401,131 | 8/1983 | Lawson | 134/184 X |
| 4,543,130 | 9/1985 | Schwartzman | 134/184 X |
| 4,602,184 | 7/1986 | Meitzler | 310/322 |
| 4,705,054 | 11/1987 | Fields | 134/184 X |
| 4,736,759 | 4/1988 | Coberly et al. | 134/184 X |
| 4,736,760 | 4/1988 | Coberly et al. | 134/184 X |
| 4,804,007 | 2/1989 | Bran | 134/184 |
| 4,854,337 | 8/1989 | Bunkenburg et al. | 134/184 |
| 4,869,278 | 9/1989 | Bran | 134/184 |

Primary Examiner—Philip R. Coe
Attorney, Agent, or Firm—Hugh D. Jaeger

[57] ABSTRACT

A high frequency ultrasonic system for sonically removing particles from substrates or wafers held in a carrier or carriers in a tank of liquid, such as DI water. A frame encompasses the tank and supports the transducer housing at an angle with respect to the tank bottom and also provides for horizontal movement between the sides of the tank. A transducer housing supports at least one transducer within the transducer housing. The transducer housing can be supported and moved at an angle with respect to the tank bottom.

15 Claims, 16 Drawing Sheets

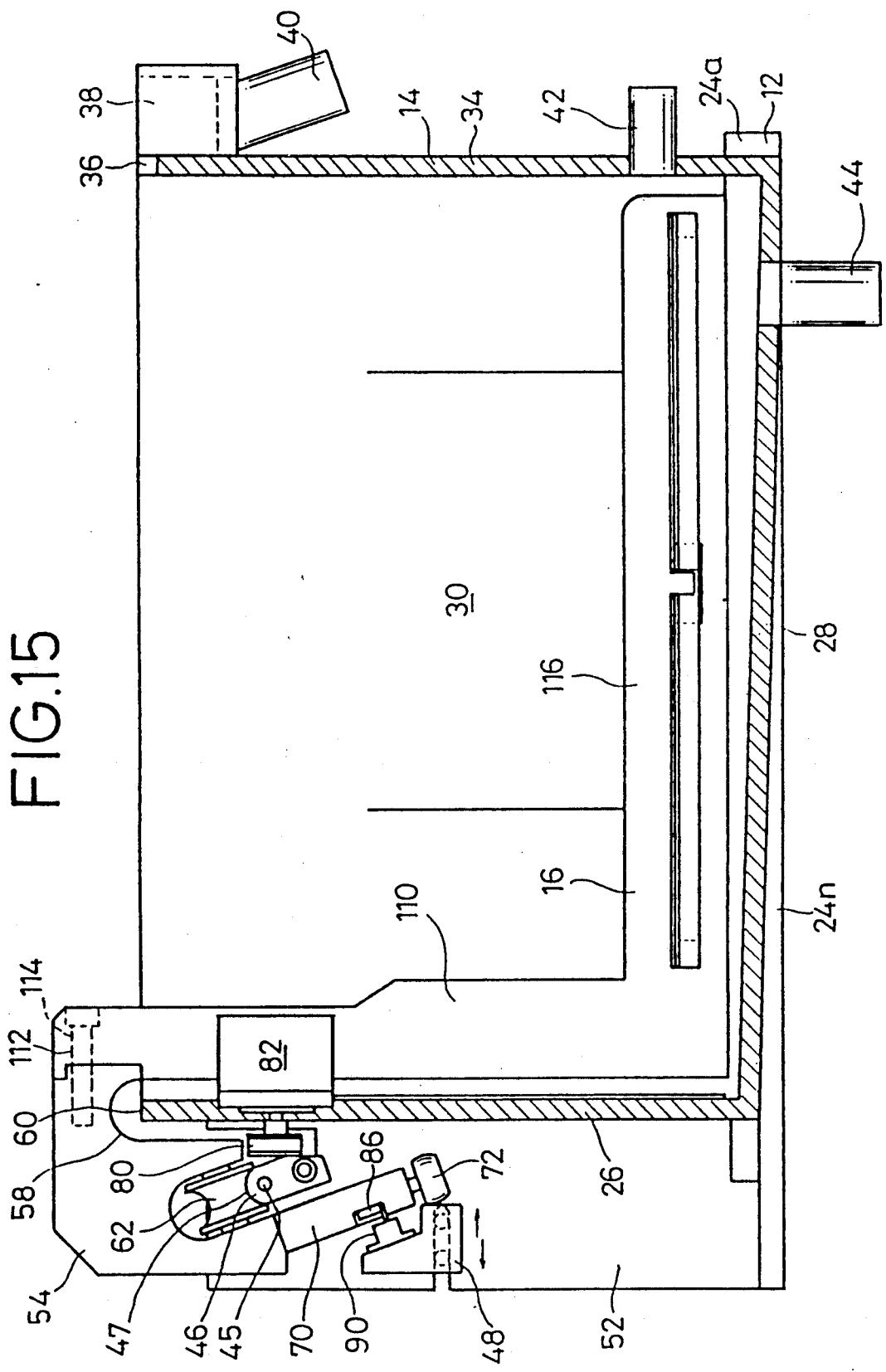

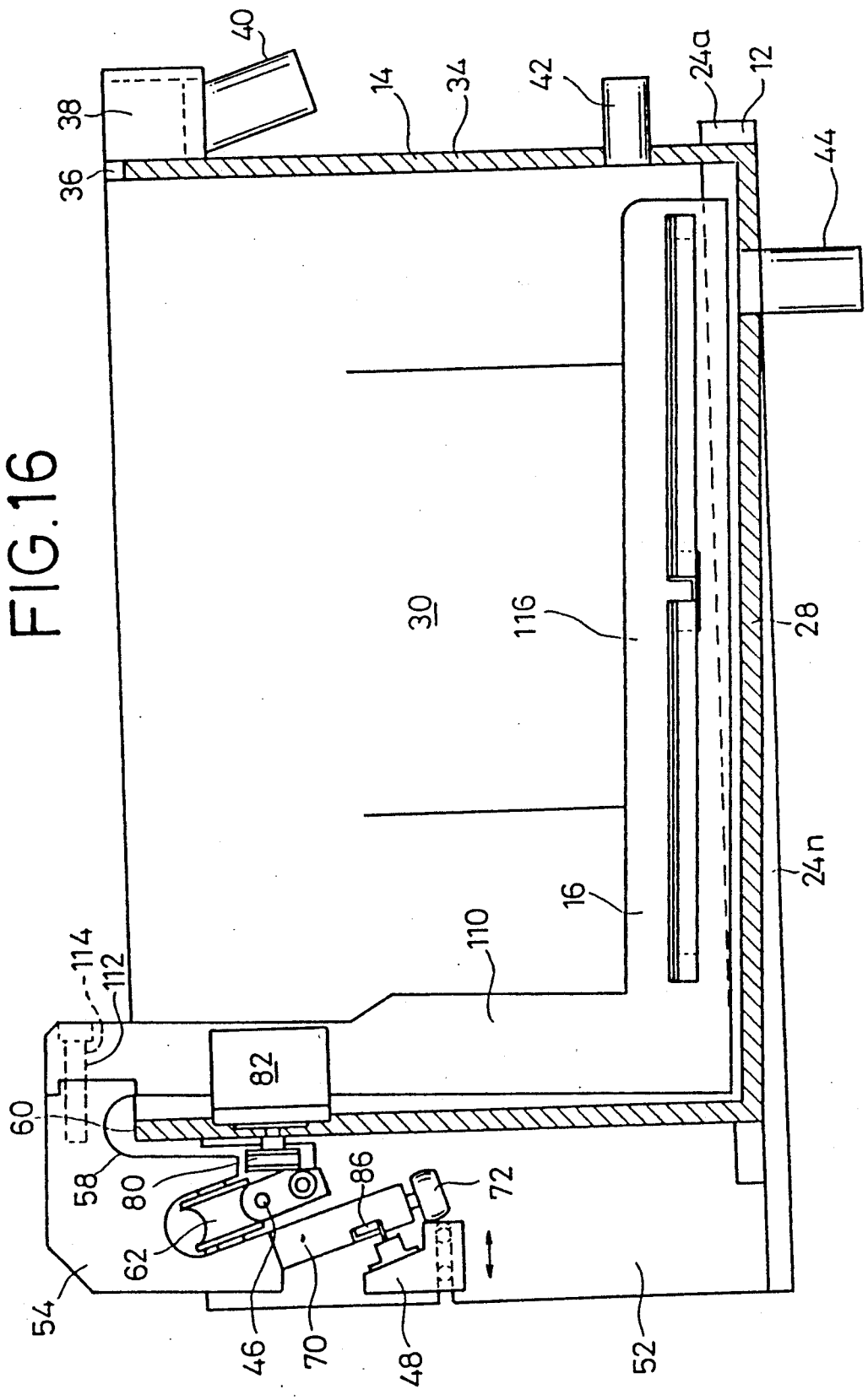

HIGH FREQUENCY ULTRASONIC SYSTEM

BACKGROUND OF THE INVENTION

1. Field of the Invention

The present invention is a high frequency ultrasonic system, and more particularly, pertains to a high frequency ultrasonic system which includes a frame assembly supporting a movable and tiltable transducer housing and a removable tank which is encompassed by the frame assembly.

2. Description of the Prior Art

Ultrasonic cleaning systems are known in the prior art. U.S. Pat. No. 4,804,007 issued to Braun teaches a typical mechanical configuration for mounting ultrasonic transducers though improved designs use more effective materials for covering the transducer. A typical ultrasonic system is taught in U.S. Pat. No. 3,893,869 issued to Mayer, et al. The problem presented by this system is that the wafers to be cleaned and the ultrasonic transducer are fixed relative to each other.

One way of correcting that problem is found in U.S. Pat. No. 4,736,759 issued to Coberly, et al. Unfortunately, this system moves the wafers within the solution tank. This tends to require complex robotic equipment and causes excess agitation of the particulates in the tank.

A partial solution is proposed in U.S. Pat. No. 4,854,337 issued to Bunkenburg, et al. In this system, the transducers are mounted on a frame, which is moved relative to the stationary wafers within the tank. The transducer frame is supported by the outer edge of the tank. This approach provides suboptimal cleaning because the transducers are at a fixed angle with regard to the wafers, and because the transducer frame rests on the outer edge of the tank. Therefore, one wall of the tank becomes subject to mechanical stress from the moving transducer frame.

The present invention overcomes the deficiencies which are found in the prior art system, and provides a new and novel system with a tiltable transducer.

SUMMARY OF THE INVENTION

The general purpose of the present invention is the cleaning of particles from wafers or substrates using a high frequency ultrasonic system with a frequency range of 500 kHz to 2.2 mHz, nominally at 950 kHz, in a tank of liquid such as DI water or other suitable cleaning solution.

According to one embodiment of the present invention, there is provided a solution tank into which a carrier of wafers or substrates is inserted. The carrier, which may be of a variety of widths, is held by a wafer carrier rack such that the wafers are stationary and submerged in the solution. A plurality of ultrasonic transducers are rotatably mounted on a movable transducer housing. Selection of the degree of rotation of the transducers determine the angle of impingement of the ultrasonic energy against the wafers. During the cleaning process, the movable transducer housing transverses the solution tank under power of a small electric motor. The transducer housing is supported by a fixed rod located outside of the tank.

Significant aspects and features of the present invention include a high frequency ultrasonic system with a transducer housing which is movable across the plane of the wafers or substrates, and tiltable with respect to the plane of the wafers or substrates. The transducer housing is easy to remove for any cleaning or for substitution of the tank.

Another significant aspect and feature of the present invention is a tank which is independent of the transducer housing and frame assembly, and can be easily exchanged such as for cleaning or for any other reason.

A further significant aspect and feature of the present invention is the use of a stationary rod which serves as a track for the smooth continuous movement of the transducer frame. Sensors may be conveniently placed along the rod to determine transducer position and prevent excessive motion.

Having thus described the embodiments of the present invention, it is a principal object hereof to provide a high frequency ultrasonic cleaning system.

Objects of the present invention include a high frequency ultrasonic system with a transducer housing including a magnetic permeable core matching network and a ceramic transducer with a fused silica face.

BRIEF DESCRIPTION OF THE DRAWINGS

Other objects of the present invention and many of the attendant advantages of the present invention will be readily appreciated as the same becomes better understood by reference to the following detailed description when considered in connection with the accompanying drawings, in which like reference numerals designate like parts throughout the figures thereof and wherein:

FIG. 15 illustrates a cross-sectional front view of the transducer housing at 0° tilt; and, FIG. 16 illustrates a cross-sectional view of the transducer housing at 1.5° tilt.

DESCRIPTION OF THE PREFERRED EMBODIMENTS

Figure 1:
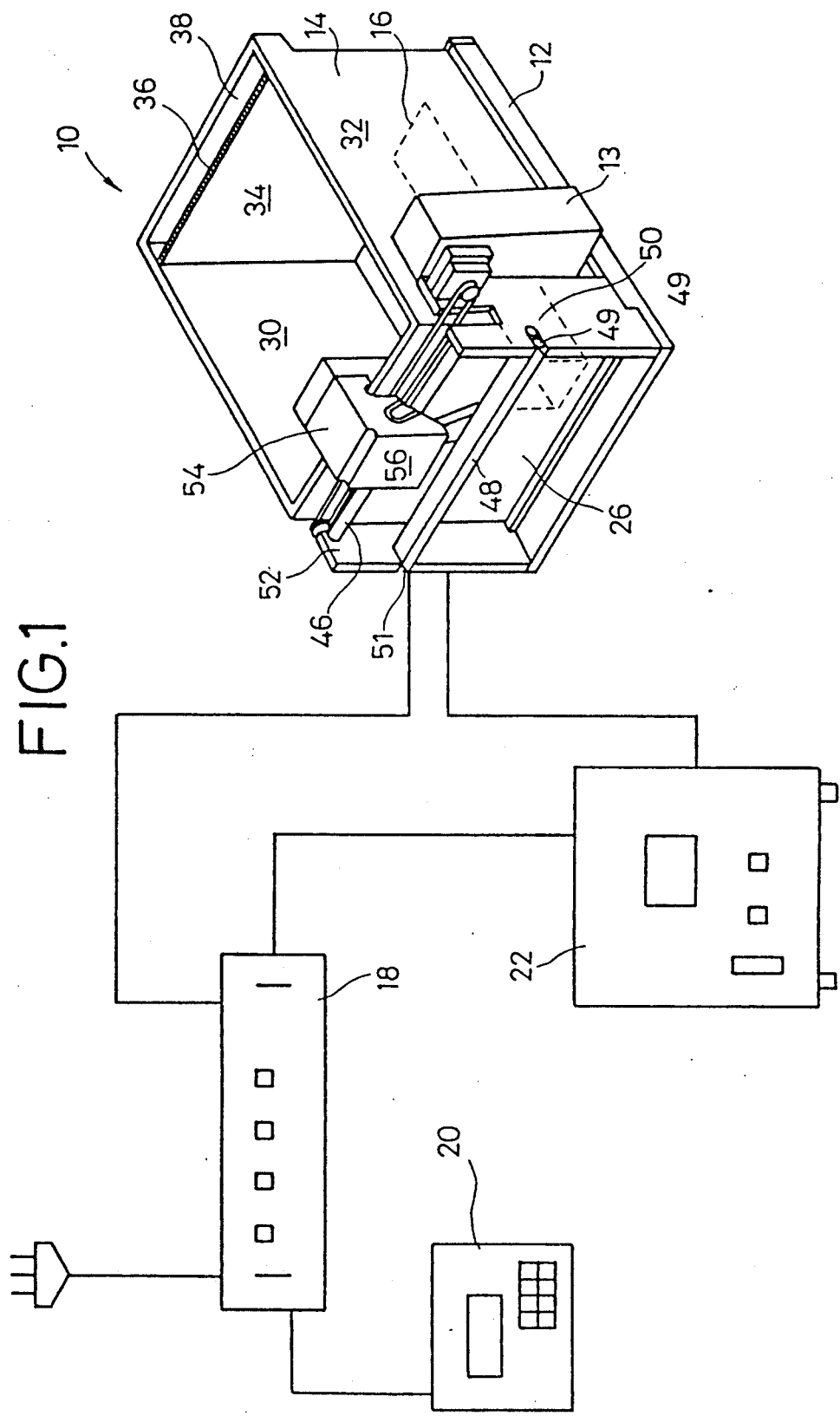
FIG. 1 illustrates a block diagram of a high frequency ultrasonic system with a perspective view of the frame assembly and a tank, the present invention.

FIG. 1 illustrates a block diagram of a high frequency ultrasonic system 10 including a frame assembly 12 supporting a motor control box 13, a tank 14, a movable cantilevered transducer housing 16 on a trolley which travels on a track on the frame assembly 12, electrical box 18, a controller 20, and an amplifier 22, all as now described in detail. The tank 14 is constructed of a suitable polymer material. The frame and other components can be constructed of a suitable polymer material.

Figure 2:
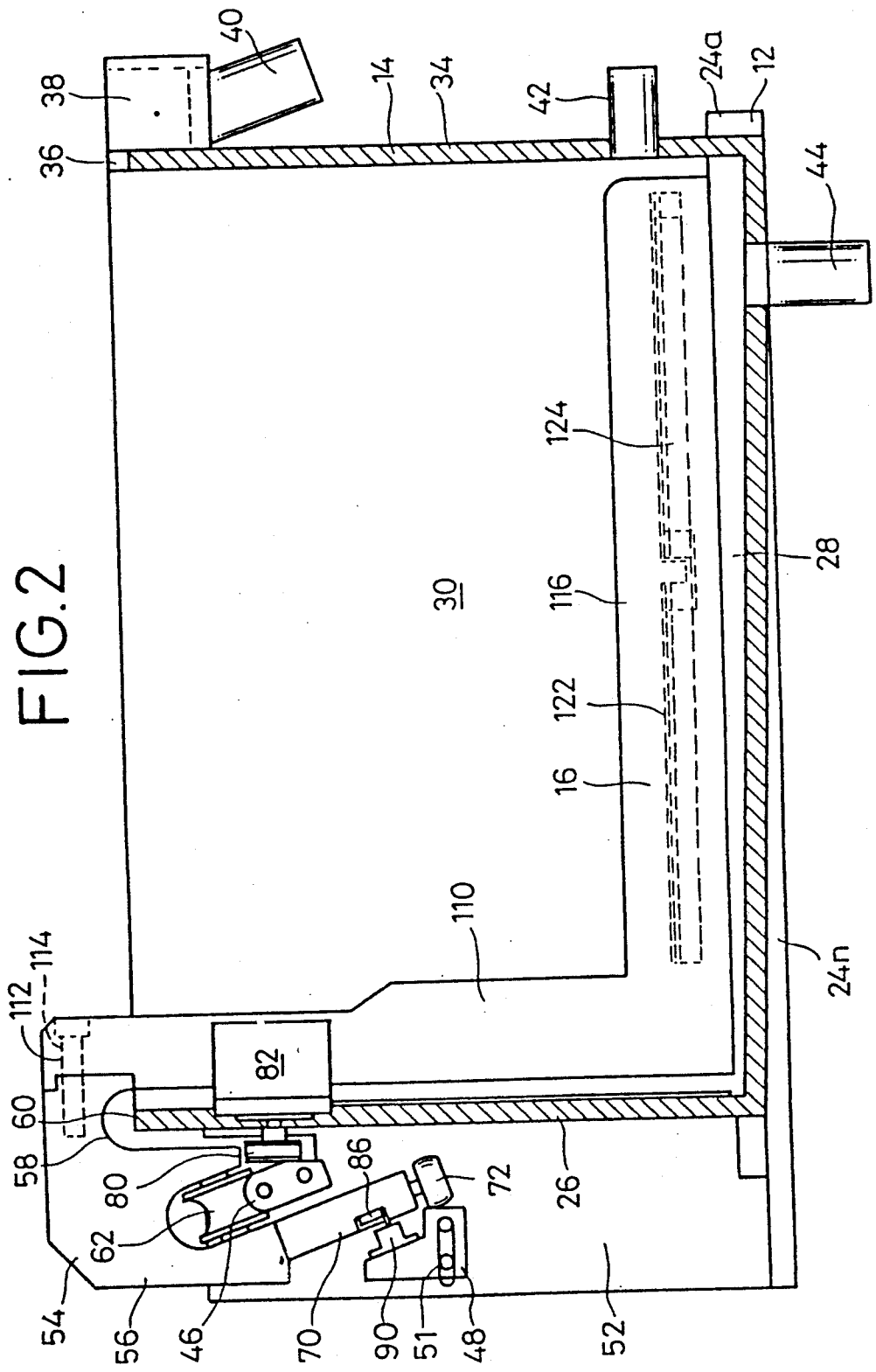
FIG. 2 illustrates a cross-sectional side view of the frame assembly and tank.

FIG. 2 illustrates a cross sectional view of the frame assembly 12 with four sided wrap-around straps 24a–24n to maintain the tank 14 in position with respect to the frame assembly 12. The tank 14 includes a flat back 26, a sloping bottom 28, two sides 30 and 32, a front 34 with a serrated edge 36, and a drain trough 38. A cascade port 40, a fill port 42 and drain 44 are suitably positioned. A stationary rod or track 46 and an adjustable position rod or track 48 for the movable transducer housing 16 secure between opposing rear edges 50 and 52 of the frame assembly 12. The adjustable position rod 48 is adjustable between slots 49 and 51 of the opposing rear edges 50 and 52.

Figure 3:
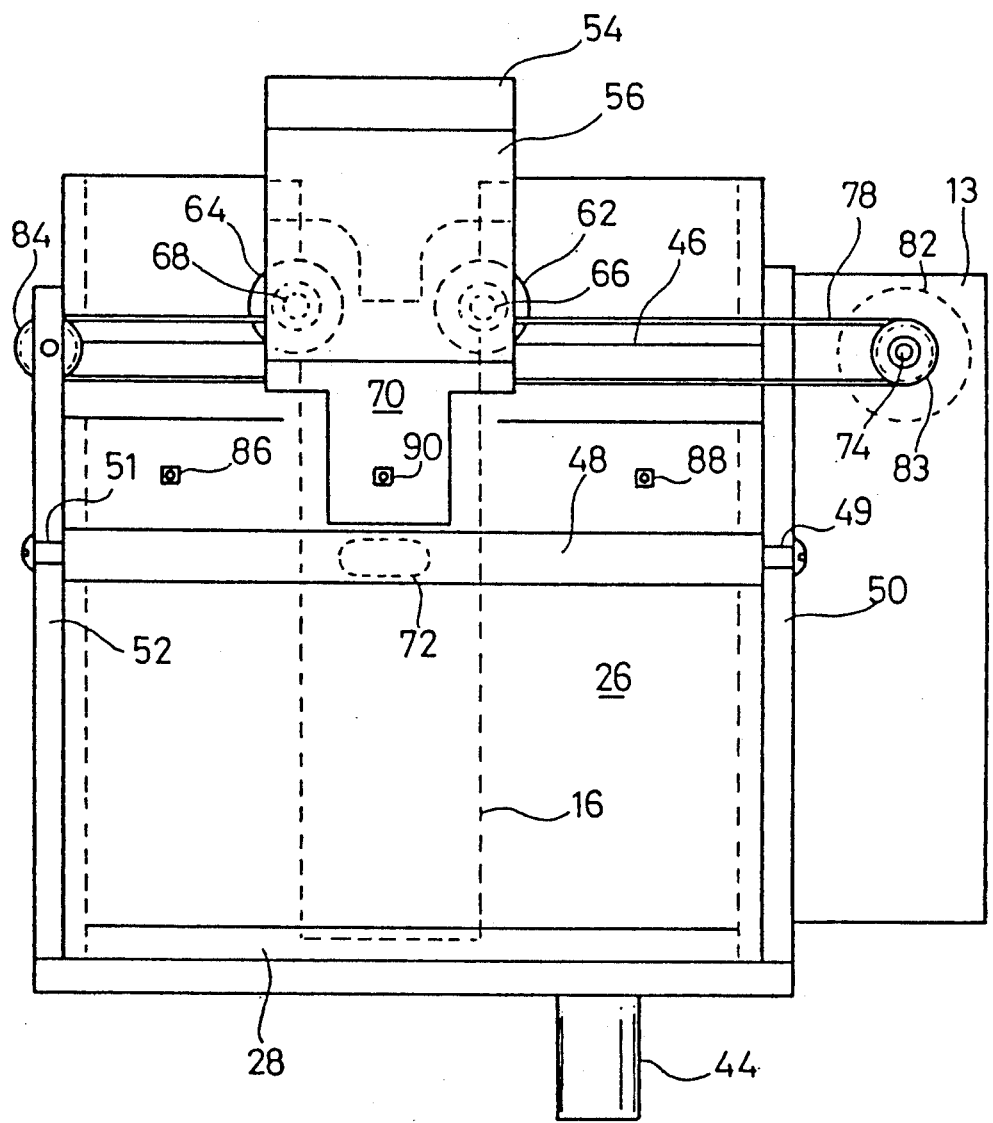
FIG. 3 illustrates a rear view of the high frequency ultrasonic system.

A trolley 54 which rides on the stationary rod 46 includes a geometrically configured trolly bracket 56 including an indent 58 for engaging over the back top edge 60 of the tank 14. The trolley 54 includes two nearly vertical wheels 62 and 64 on shafts 66 and 68 which are supported in the trolley bracket 56 as also illustrated in FIG. 3. A plate support 70 affixes to the trolley bracket 56 for supporting a nearly horizontal wheel 72. A timing belt 78 affixes to an under edge 80 of the trolley bracket 56, such as with screws, and connects to a stepper motor 82 in a motor control box 13 on a shaft 74. A pulley 83 affixes over shaft 74 of the stepper motor 82. Another pulley 84 affixes to the opposing rear edge 52. The timing belt 78 aligns over and about the pulleys 83 and 84 so that the trolley 54 and the movable transducer housing 16 can be horizontally positioned along the stationary rod 46 by actuation of the stepper motor 82. The motor control box 13 also includes a terminal strip, high and low liquid level sensor switches, and $N_2$ feed through for cooling the transducers and purging the motor box with $N_2$. Stop limit optical sensors 86 and 88 position about the adjustable position rod 48 for interaction with a flag tab 90 carried on the trolley 54 for limiting edge-to-edge travel of the trolley 54.

FIG. 3 illustrates a rear view of the high frequency ultrasonic system 10 where all numerals correspond to those elements previously described.

Figure 4:
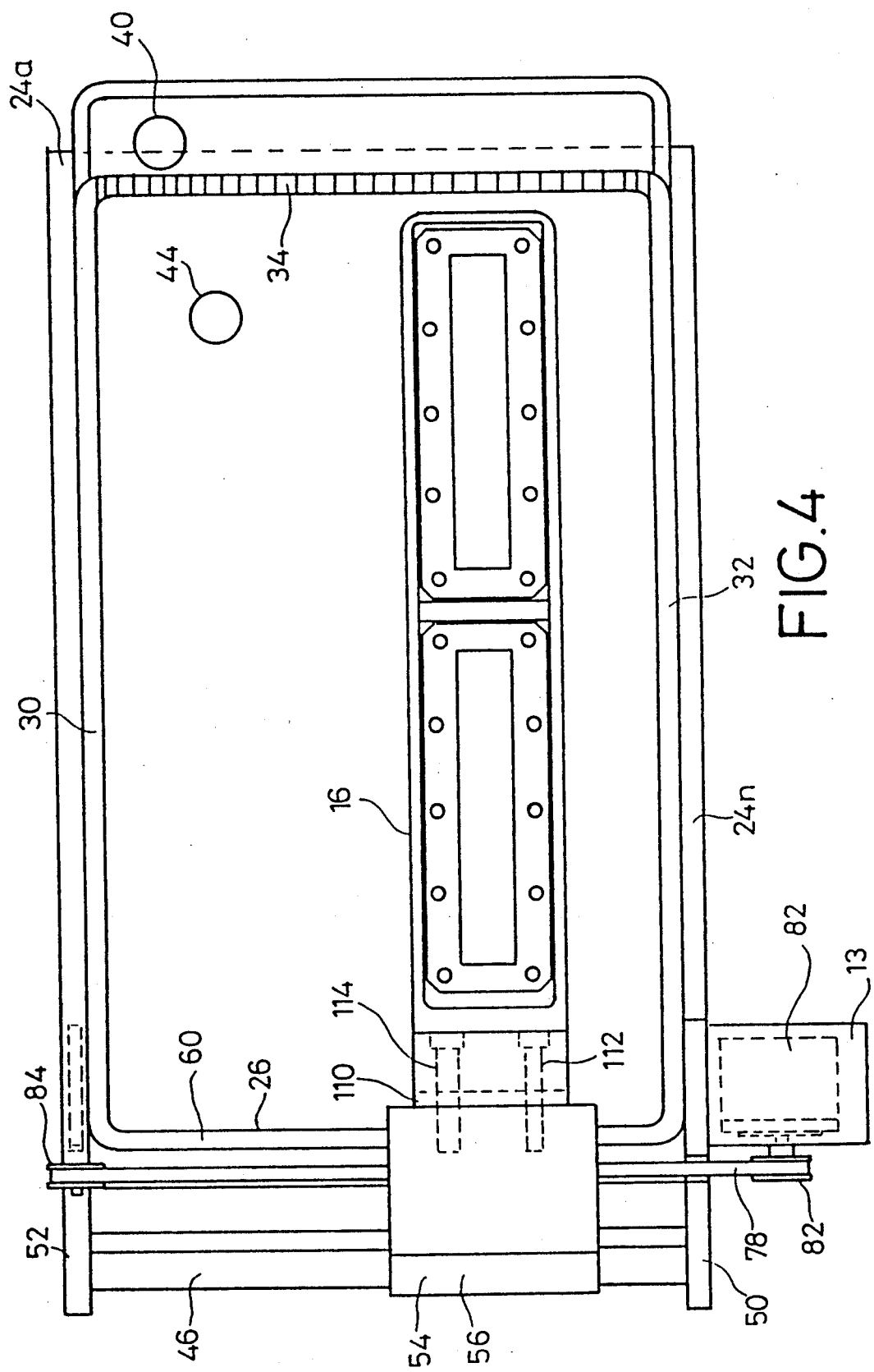
FIG. 4 illustrates a top view of the high frequency ultrasonic system.

FIG. 4 illustrates a top view of the high frequency ultrasonic system 10 where all numerals correspond to those elements previously described.

Figure 5:
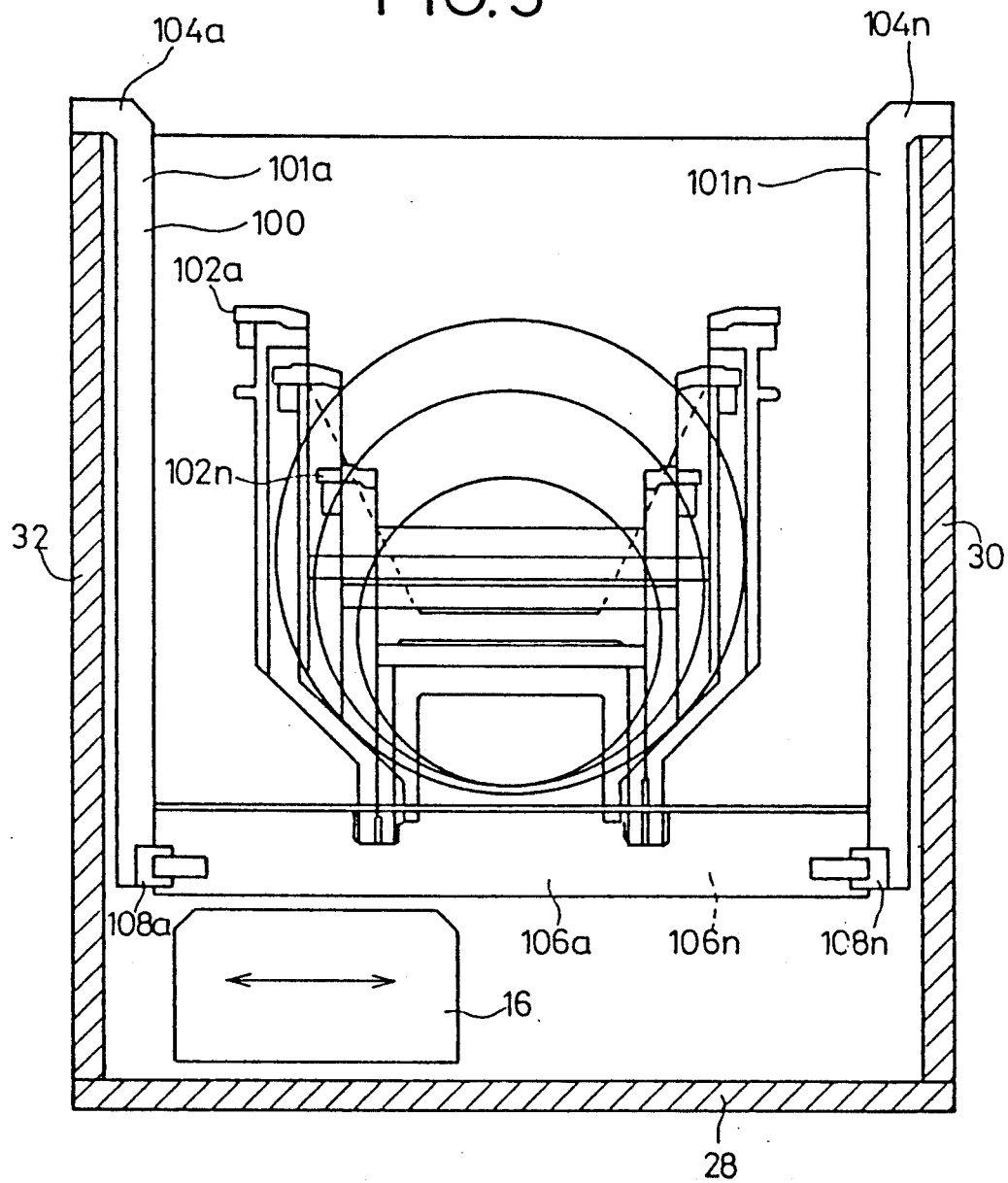
FIG. 5 illustrates a cross-sectional front view of the tank including a wafer carrier rack with a wafer carrier.
Figure 6:
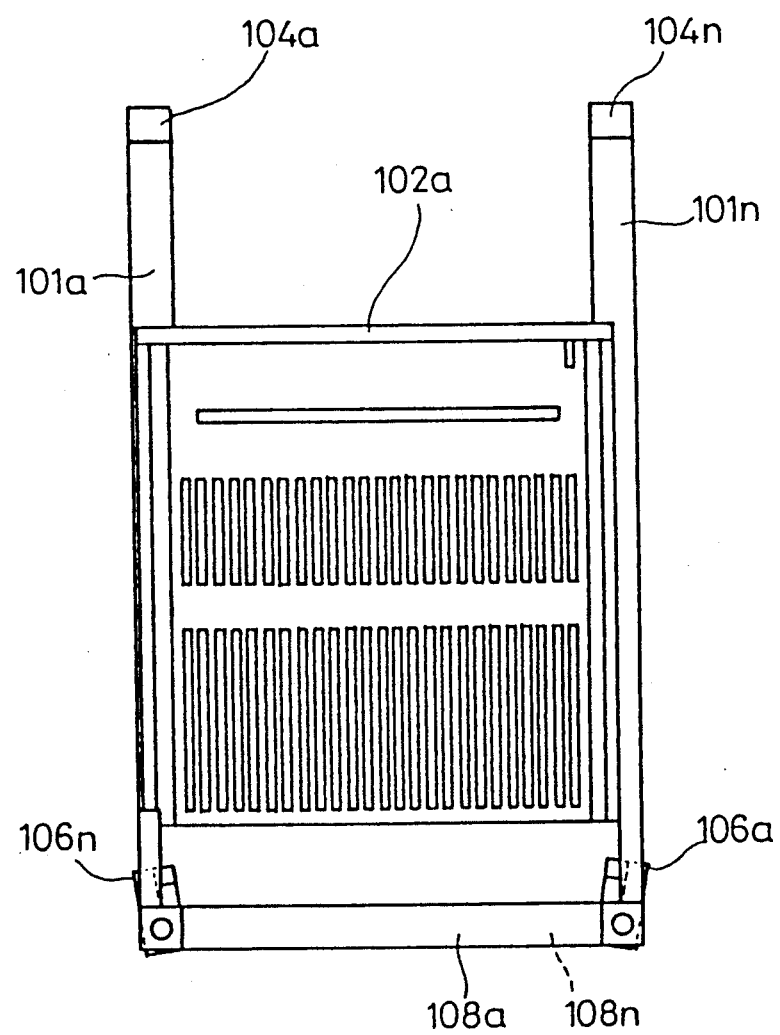
FIG. 6 illustrates a cross-sectional side view of the wafer carrier rack with a wafer carrier.

FIG. 5 illustrates a cross-sectional front view of the tank 14 including a wafer carrier rack 100 and various sized wafer carriers 102a–102n residing in the wafer carrier rack 100. The wafer carrier rack 100 includes angled top members 104a–104n which rest on the top edges of the tank sides 30 and 32. The moveable transducer housing 16 moves laterally beneath the wafer carrier rack 100 containing the wafer cassettes 102a–102n. The wafer carrier rack 100 also includes vertical bars 101a–101n and horizontal cross bars 106a–106n secured therebetween as also illustrated in FIG. 6. Another set of horizontal cross bars 108a–108n extend between the lower ends of the vertical bars 101a–101n and the ends of the horizontal cross bars 106a–106n. The area between the horizontal cross bars 106a–106n and 108a–108n is open, thus exposing the wafer cassettes 102a–102n to the moveable transducer housing 16.

FIG. 6 illustrates a side view in cutaway of the wafer carrier rack 100 with a wafer 102a where all numerals correspond to those elements previously described.

Figure 7:
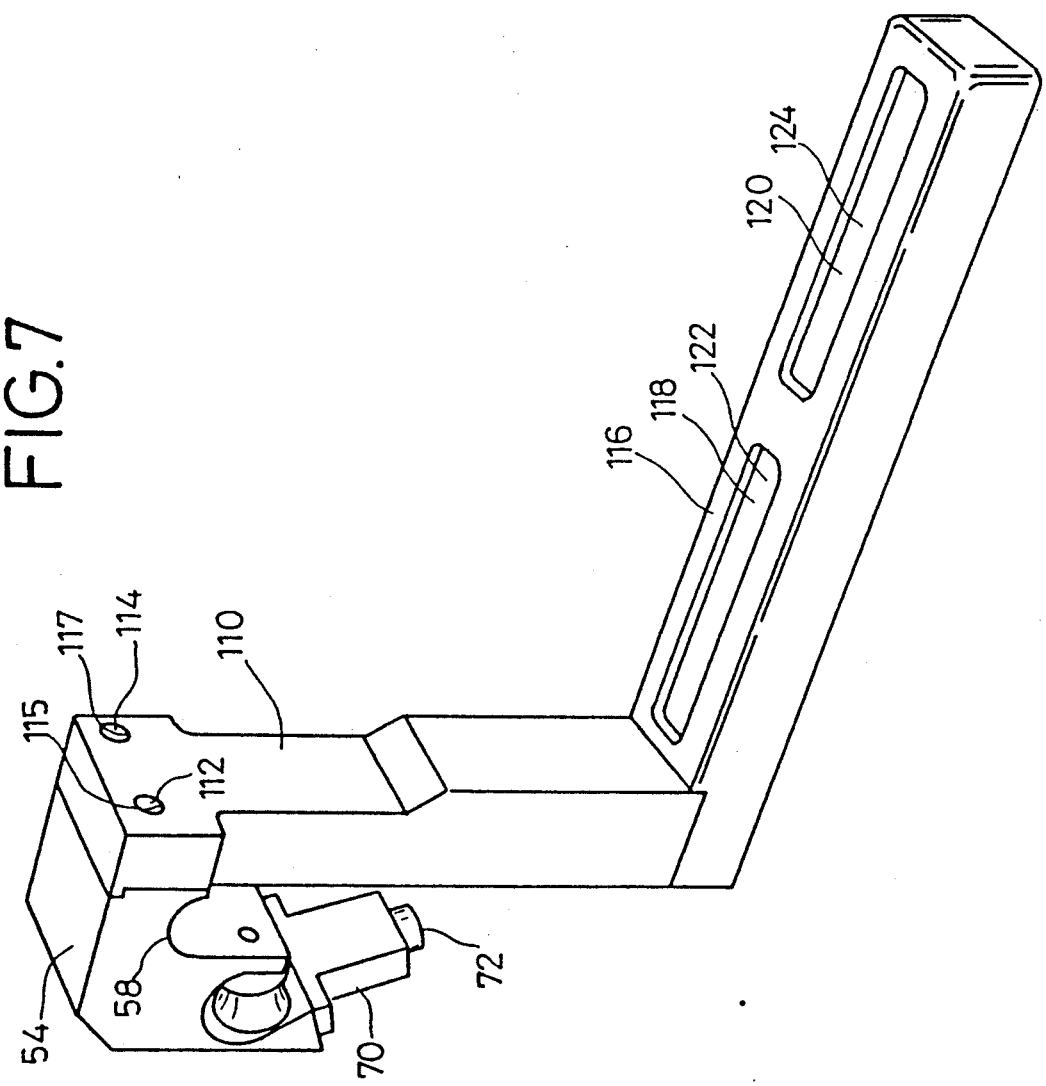
FIG. 7 illustrates a perspective view of the transducer housing.

FIG. 7 illustrates a perspective view of the movable transducer housing 16 and the trolley 54 where all numerals correspond to those elements previously described. The movable transducer housing 16 includes a vertically oriented top housing 110 secured to the trolley 54 by screw fasteners 112 and 114 through holes 115 and 117 and a horizontally aligned bottom housing 116 secured to the top housing 110. The bottom housing 116 includes cavities 118 and 120 in which transducers 122 and 124 are housed and sealed.

Figure 8:
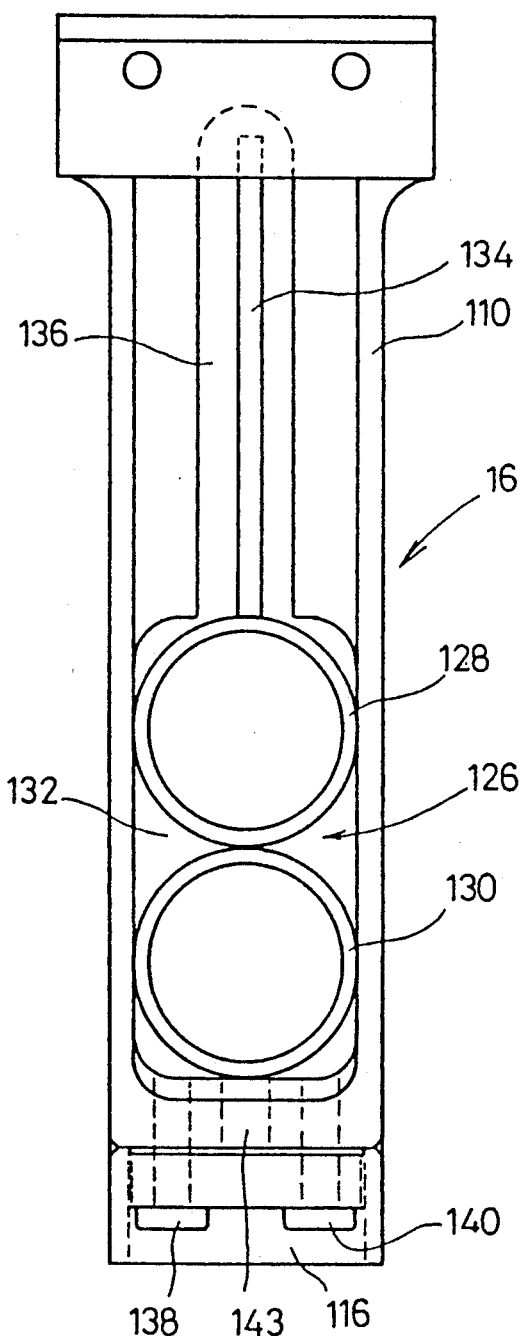
FIG. 8 illustrates a cross-sectional rear view of the transducer housing.

FIG. 8 illustrates a rear view in partial cross section of the movable transducer housing 16 including a matching network assembly 126 including coils 128 and 130 secured in a lower cavity 132 in the top housing 110 and a coaxial cable 134 in an upper cavity 136 Screw fasteners 138 and 140 secure the bottom housing 116 to the top housing 110.

Figure 9:
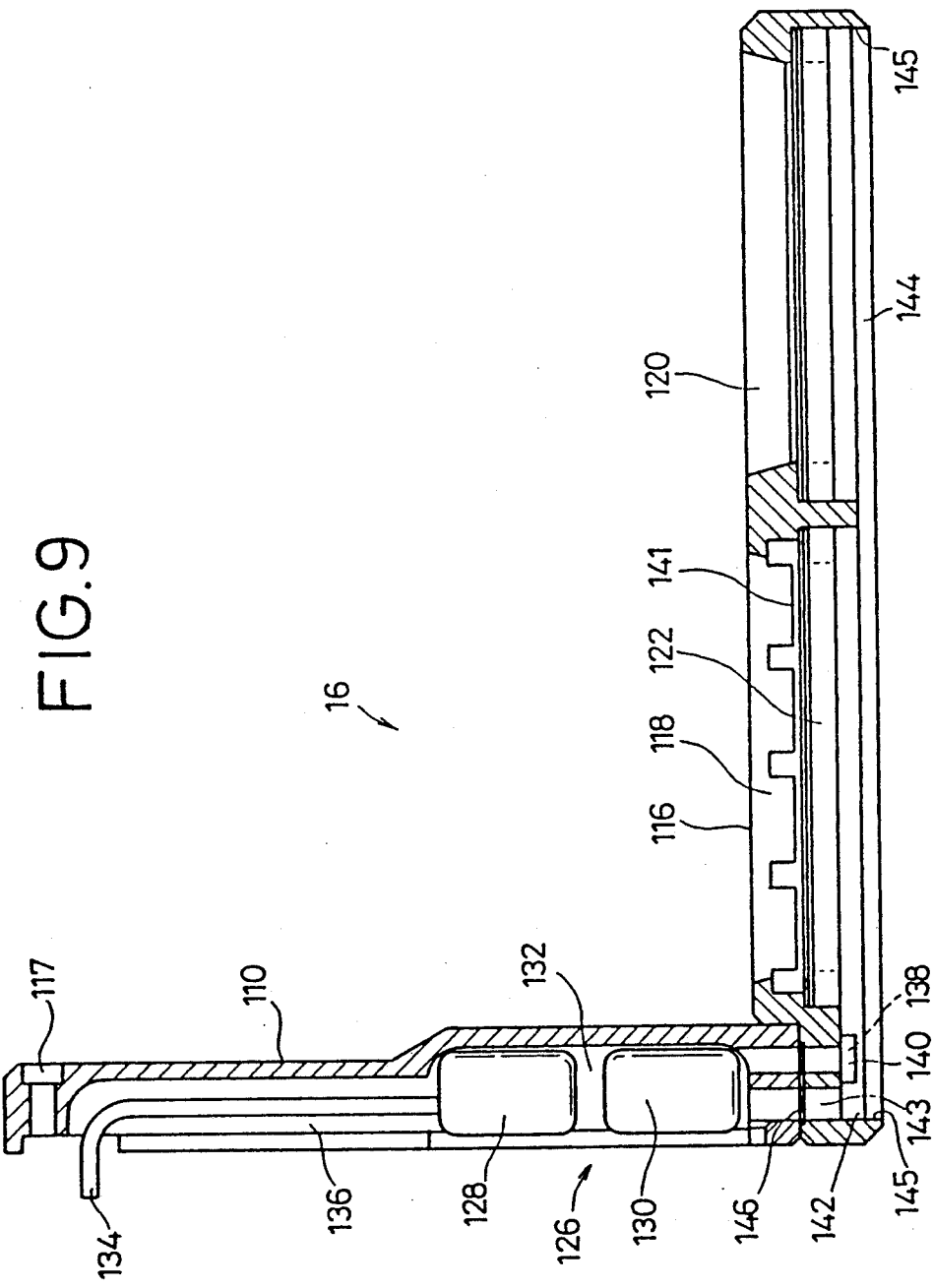
FIG. 9 illustrates a side view of the transducer housing.

FIG. 9 illustrates a side view in partial cutaway of the moveable transducer housing 16 where all numerals correspond to those elements previously described. The movable transducer housing 16 includes a ceramic transducer material plate 141 such as PZT4 with an interference layer, such as fused silica or a PVDF face. A leak detector 142 is included in the bottom portion of the bottom housing 116. A plug 144 extends along the bottom inside lip 145 of the bottom housing 116 to seal the transducers 122 and 124 in the bottom housing 116. The transducers 122 and 124 reside in the lower regions of the cavities 118 and 120. A hole 143 extends between the lower cavity 132 and the lower region of the cavity 118. The upper portions of cavities 118 and 120 have angled walls in the upper region and straight vertically oriented walls in the lower region. The transducers 122 and 124 are accommodated by the vertical walls of the lower region of the cavities 118 and 120. A gasket 146 seals the top housing 110 to the bottom housing 116.

Figure 10:
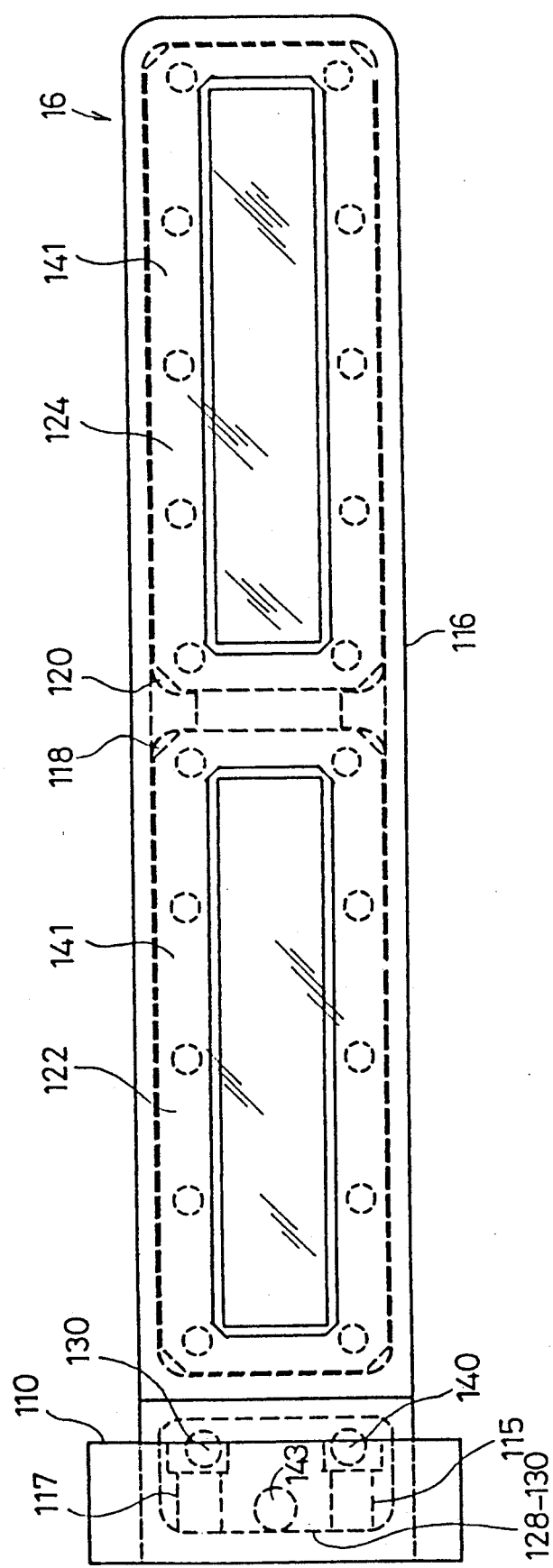
FIG. 10 illustrates a top view of the transducer bottom housing.

FIG. 10 illustrates a top view of the movable transducer housing 16 where all numerals correspond to those elements previously described.

Figure 11:
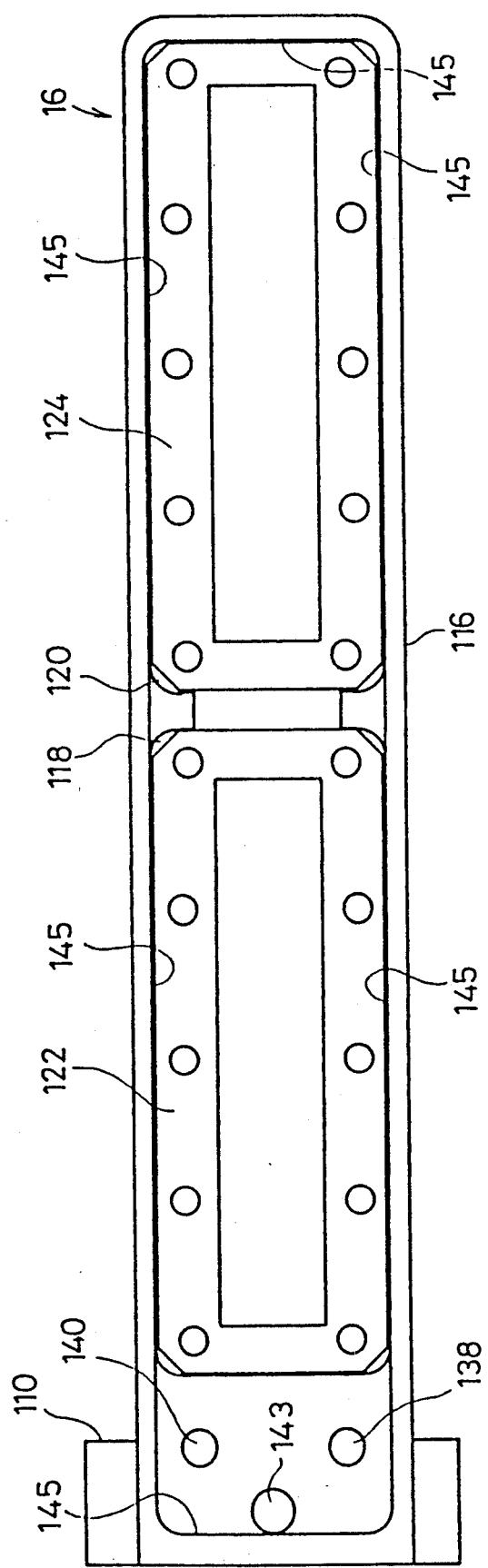
FIG. 11 illustrates a bottom view of the transducer bottom housing.

FIG. 11 illustrates a bottom view of the movable transducer bottom housing 16 where all numerals correspond to those elements previously described. The plug 144 is removed in this illustration for purposes of brevity and clarity.

Figure 12:
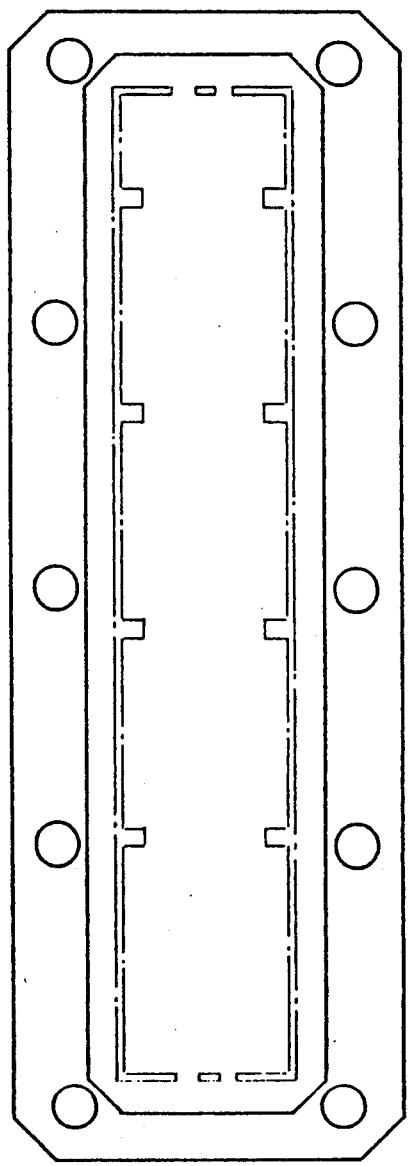
FIG. 12 illustrates a top view of the transducer.

FIG. 12 illustrates a top view of a transducer 122 where all numerals correspond to those elements previously described.

Figure 13:
FIG. 13 illustrates a side view of the transducer.

FIG. 13 illustrates a side view of a transducer 122 where all numerals correspond to those elements previously described.

Figure 14:
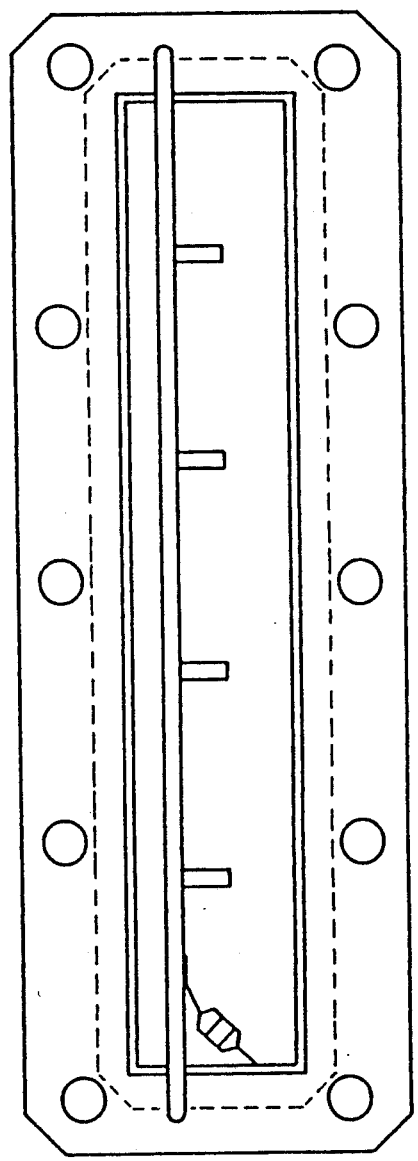
FIG. 14 illustrates a bottom view of the transducer.

FIG. 14 illustrates a bottom view of a transducer 122 where all numerals correspond to those elements previously described.

FIG. 15 illustrates a cross-sectional view of the high frequency ultrasonic system where all numerals correspond to those elements previously described. The bottom housing 116 is horizontally adjusted and positioned flat and level at zero degrees tilt. The angle of adjustment of the bottom housing with relation to horizontal depends on the longitudinal positioning of the adjustable position rod 48 between the rear edges 50 and 52. The trolley 54 and the attached movable transducer housing 16 pivot about a pivot point 45 which is the center point of the arc 47 at the top portion of the stationary rod 46. The trolley 54, the near vertical wheel 62 and the movable transducer housing 16 are pivoted about the pivot point 45. The amount of pivotal rotation about the pivot point 45 is adjusted and limited by the adjustable position rod 48 against which the plate support 70 mounted near horizontal wheel 72 maintains contact.

FIG. 16 illustrates a cross-sectional view of the high frequency ultrasonic system where all numerals correspond to those elements previously described. The adjustable position rod 48 has been moved outwardly to the left allowing the trolley 54 and the movable transducer housing 16 to rotate clockwise about the pivot point 45, thus allowing the bottom housing 116 to maintain an angle less than horizontal, causing the emitted energy direction to be skewed off the vertical plane such as 1.5° as illustrated. The preferred mode employs a rotation of from 0° to 45°.

MODE OF OPERATION

The electrical operation of the high frequency ultrasonic system is controlled by a microprocessor in the electrical box according to stored programs and accessed by an operator through a controller. The electrical box includes a stepper motor driver, an Eltec CPU board, an input board for the input signals from the sensors, a driver board for valves, and an amplifier board for the frequency synthesizer and the amplifier control lines. In the transducer housing, $N_2$ purge, RF coax cable, and lead connector run through internal voids to the transducer housing bottom. In the motor box, the motor drive cables, liquid level sensor, the sensor and the $N_2$ feed for the level detector, the leak detector cable and the $N_2$ purge for the motor box connect accordingly. The RF power amplifier is manufactured by ENI of Rochester, N.Y., and is computer controlled by the electrical box. The frequency of operation of the amplifier is selected by the microprocessor. The programs determine the power, number of cycles, and transducer velocity. The transducer housing can be tilted from a 0° to 45° tilt, nominally about 5° tilt to adjust the upward energy direction of the ultrasonic energy against the wafers or substrates. The wafers can be blocked from the ultrasonic energy field based on the alignment of the wafers or substrates in a carrier.

Fluids such as DI water, SCI, SCII, choline based solutions, or HF are typical cleaning and etching solutions for use with the system.

Various modifications can be made to the present invention without departing from the apparent scope hereof.

We claim:

1. A high frequency ultrasonic system comprising:
  a. a frame assembly including two opposing rear edges, an upper stationary rod and a lower adjustable position rod extending therebetween;
  b. a tank for liquid retained within said frame assembly for receiving a carrier with substrates or wafers;
  c. a trolley including a trolley bracket supporting at least one wheel for riding on said upper stationary rod and at least one wheel for riding on said lower adjustable position rod;
  d. a cantilevered transducer housing connected to said trolley bracket and supporting at least one transducer in a lower portion of said housing for movement in said tank at an adjustable angle with respect to a bottom of the tank; and,
  e. matching network means in an upper portion of said housing and connected between a high frequency ultrasonic source and said transducer.

2. System of claim 1 wherein said transducer is ceramic material with a fused silica face.

3. System of claim 1 wherein said matching network includes two magnetic permeable cores.

4. System of claim 1 including a moisture sensor means in a lower arm of said transducer housing.

5. System of claim 1 including an inert gas purge means in a lower arm of said transducer housing and means connecting said purge means to a source of inert gas.

6. A high frequency ultrasonic system comprising:
  a. a frame assembly including two opposing rear edges, an upper stationary rod and a lower adjustable position rod extending therebetween and including a lower wrap-around member for engaging a tank;
  b. a tank for a fluid retained in said wrap-around member of said frame assembly for receiving a carrier with substrates or wafers;
  c. a trolley including a trolley bracket supporting at least one wheel for riding on said upper stationary rod and at least one wheel for riding on said lower adjustable position rod;
  d. a cantilevered transducer housing connected to said trolley bracket and supporting at least one transducer in a lower portion of said housing for movement in said tank at an adjustable angle with respect to a bottom of the tank; and,
  e. matching network means in an upper portion of said housing and connected between a high frequency ultrasonic signal source and said transducer.

7. A high frequency ultrasonic system comprising:
  a. a frame assembly including two opposing rear edges, an upper stationary track and a lower adjustable position track extending therebetween and including a wrap-around member for engaging a tank;
  b. a tank for liquid retained in said wrap-around member of said frame assembly for receiving a carrier with substrates or wafers;
  c. a trolly including a trolley bracket supporting at least two wheels for riding on said upper stationary rod and at least one wheel for riding on said lower adjustable position track;
  d. an L-shaped transducer housing connected to said trolley bracket and supporting at least two transducers in a lower portion of said housing for movement in said tank at an adjustable angle with respect to a bottom of the tank;
  e. means for generating a high frequency ultrasonic RF signal; and,
  f. matching network means in an upper portion of said housing and connected between said signal means and said transducer means.

8. A high frequency ultrasonic system comprising:
  a. a frame assembly including two opposing rear edges, an upper stationary rod and a lower adjustable position rod extending therebetween and including a lower wrap-around member for engaging a tank;
  b. a tank for a fluid retained in said wrap-around member of said frame assembly for receiving a carrier with substrates or wafers;

c. a trolley including a trolley bracket supporting at least one wheel for riding on said upper stationary rod and at least one wheel for riding on said lower adjustable position rod and for positioning an angle of said trolley; and, d. a cantilevered transducer housing connected to said trolley bracket and supporting at least one transducer in a lower portion of said housing for movement in said tank with respect to a bottom of the tank.

9. A high frequency ultrasonic system comprising:

a. a frame assembly including two opposing rear edges, an upper stationary track and a lower adjustable position track extending therebetween and including a wrap-around member for engaging a tank;

b. a tank for liquid retained in said wrap-around member of said frame assembly for receiving a carrier with substrates or wafers;

c. a trolly including a trolley bracket supporting at least two wheels for riding on said upper stationary rod and at least one wheel for riding on said lower adjustable position track;

d. an L-shaped transducer housing connected to said trolley bracket and supporting at least one transducer in a lower portion of said housing for movement in said tank at an adjustable angle with respect to a bottom of the tank; and, e. means for generating a high frequency ultrasonic RF signal connected between said signal means and said transducer means.

10. A high frequency ultrasonic system of claim 1 comprising a serrated edge and a drain trough adjacent said serrated edge, said serrated edge at a front of said tank.

11. A high frequency ultrasonic system of claim 10 comprising means connected to said lower adjustable position rod for adjusting the angle of ultrasonic energy radiating from said transducer.

12. A high frequency ultrasonic system of claim 1 wherein said high frequency ultrasonic source connected to said transducer operates in a megasonic frequency range.

13. A high frequency ultrasonic system of claim 9 comprising a serrated edge and a drain trough adjacent said serrated edge said serrated edge at a front of said tank.

14. A high frequency ultrasonic system of claim 13 comprising means connected to said lower adjustable position rod for adjusting the angle of ultrasonic energy radiating from said transducer.

15. A high frequency ultrasonic system of claim 9 wherein said high frequency ultrasonic source connected to said transducer operates in a megasonic frequency range.

* * * * *